(12) United States Patent
Matsumoto et al.

(10) Patent No.: US 12,211,719 B2
(45) Date of Patent: Jan. 28, 2025

(54) METHOD OF CONTROLLING SUBSTRATE TRANSFER SYSTEM AND THE SUBSTRATE TRANSFER SYSTEM

(71) Applicant: Tokyo Electron Limited, Tokyo (JP)

(72) Inventors: Wataru Matsumoto, Nirasaki (JP); Takehiro Shindo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 487 days.

(21) Appl. No.: 17/410,241

(22) Filed: Aug. 24, 2021

(65) Prior Publication Data

US 2022/0068683 A1   Mar. 3, 2022

(30) Foreign Application Priority Data

Aug. 31, 2020   (JP) .................................. 2020-146296

(51) Int. Cl.
*H01L 21/677* (2006.01)
*H01L 21/67* (2006.01)

(52) U.S. Cl.
CPC .. *H01L 21/67706* (2013.01); *H01L 21/67742* (2013.01); *H01L 21/67248* (2013.01)

(58) Field of Classification Search
CPC ............... H01L 21/67; H01L 21/67706; H01L 21/67742; H01L 21/67248;
(Continued)

(56) References Cited

U.S. PATENT DOCUMENTS

2017/0018446 A1* 1/2017 Yin .......................... H01L 21/68
2017/0162421 A1* 6/2017 Sakaue ............. H01L 21/67748
(Continued)

FOREIGN PATENT DOCUMENTS

JP    2007-027378 A    2/2007
JP         5036290 B2 *  9/2012 ....... H01L 21/67248
KR 10-2018-0122370 A   11/2018

OTHER PUBLICATIONS

Warner, Jack. "A Look at Belt, Chain and Gear Drive Technology." Power Transmission Engineering Magazine RSS, Power Transmission Engineering Magazine, Nov. 28, 2017, www.powertransmission.com/blogs/4-editors-choice/post/105-a-look-at-belt-chain-and-gear-drive-technology. (Year: 2017).*
(Continued)

*Primary Examiner* — Yoshihisa Ishizuka
*Assistant Examiner* — Joshua L Forristall
(74) *Attorney, Agent, or Firm* — Nath, Goldberg & Meyer; Jerald L. Meyer; Tanya E. Harkins

(57) ABSTRACT

A method of controlling a substrate transfer system including a transfer mechanism having a holder, and a measurement part that detects an outer periphery of the substrate to measure a center position of the substrate, thereby transferring the substrate to a target position, includes: correcting the target position based on an amount of positional deviation between a reference position of the holder and the center position of the substrate, a first amount of thermal displacement of the reference position of the holder by thermal expansion of the transfer mechanism at a measurement position where the outer periphery of the substrate is detected, and a second amount of thermal displacement of the reference position of the holder by the thermal expansion of the transfer mechanism at the target position; and controlling the transfer mechanism such that the reference position of the holder becomes the corrected target position.

4 Claims, 7 Drawing Sheets

(58) Field of Classification Search
CPC ............. H01L 21/67259; H01L 21/681; H01L 21/67739; H01L 21/67155; H01L 21/67196; H01L 21/68; H01L 21/67718; H01L 21/68785
USPC .......................................................... 702/99
See application file for complete search history.

(56) References Cited

U.S. PATENT DOCUMENTS

| | | | | |
|---|---|---|---|---|
| 2018/0361592 | A1* | 12/2018 | Motoyoshi | ............. B25J 9/0087 |
| 2019/0198369 | A1* | 6/2019 | Sakaue | ............. H01L 21/67742 |
| 2020/0294833 | A1* | 9/2020 | Takano | ................ C23C 16/458 |
| 2021/0223023 | A1* | 7/2021 | Romero | ................... G01B 7/30 |

OTHER PUBLICATIONS

"Gear Drive or Belt Drive?" Gear Drive or Belt Drive—La Meccanica B2Blog, Oct. 31, 2019, www.lameccanica.it/en/news/press-review-animal-feed/gear-drive-or-belt-drive. (Year: 2019).*

* cited by examiner

During Acceleration

During Deceleration

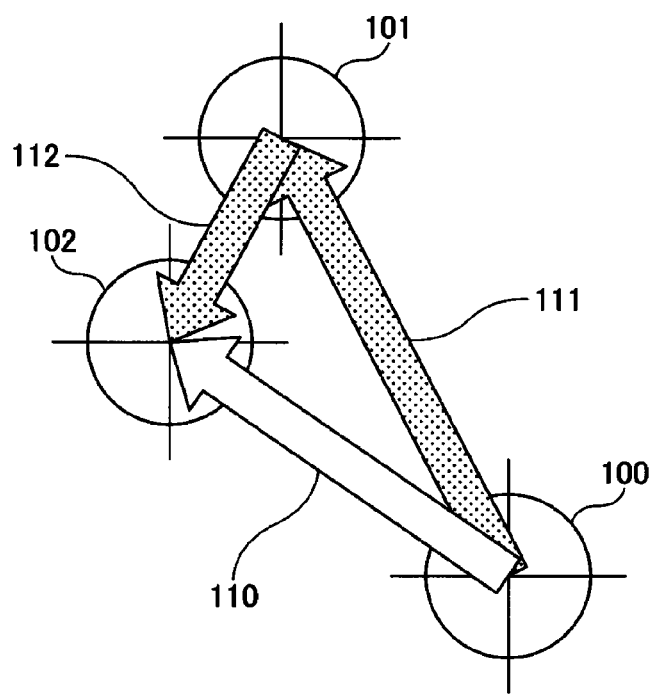

METHOD OF CONTROLLING SUBSTRATE TRANSFER SYSTEM AND THE SUBSTRATE TRANSFER SYSTEM

CROSS-REFERENCE TO RELATED APPLICATION

This application is based upon and claims the benefit of priority from Japanese Patent Application No. 2020-146296, filed on Aug. 31, 2020, the entire contents of which are incorporated herein by reference.

TECHNICAL FIELD

The present disclosure relates to a method of controlling a substrate transfer system and the substrate transfer system.

BACKGROUND

A substrate transfer system including a transfer mechanism for transferring a substrate, such as a wafer, is known.

Patent Document 1 discloses a processing system that performs a predetermined processing on a substrate. The processing system includes: a plurality of processing chambers, each configured to perform the predetermined processing on the substrate; a common transfer chamber having a predetermined length in one direction and having one side portion to which the processing chambers are commonly connected; a slider mechanism including a drive source at one end portion and a base configured to be movable in the common transfer chamber along a longitudinal direction thereof; a bendable/swingable substrate transfer mechanism installed on the base and configured to load or unload the substrate into or from the processing chambers while holding the substrate; a plurality of positional deviation detection units arranged at predetermined intervals to correspond to positions where the movement of the base is stopped and configured to detect a positional deviation of the substrate held by the substrate transfer mechanism; and a unit controller configured to control the operation of the substrate transfer mechanism such that, using a value detected by one of the plurality of positional deviation detection units as a reference detection value, thermal expansion/contraction correction is performed on values detected by the other positional deviation detection units.

Incidentally, in the transfer mechanism, each part of the transfer mechanism thermally expands due to heat generated by a power source of the transfer mechanism or transfer of a substrate having a high temperature, which may result in a degradation in transfer accuracy of the substrate.

PRIOR ART DOCUMENT

Patent Document

Patent Document 1: Japanese Laid-Open Patent Publication No. 2007-027378

SUMMARY

According to an embodiment of the present disclosure, there is provided a method of controlling a substrate transfer system including a transfer mechanism having a holder configured to hold a substrate and configured to transfer the substrate, and a measurement part configured to detect an outer periphery of the substrate being transferred by the transfer mechanism and measure a center position of the substrate, so as to transfer the substrate to a target position. The method includes correcting the target position based on an amount of positional deviation between a reference position of the holder and the center position of the substrate measured by the measurement part, a first amount of thermal displacement of the reference position of the holder by a thermal expansion of the transfer mechanism at a measurement position where the outer periphery of the substrate is detected by the measurement part, and a second amount of thermal displacement of the reference position of the holder by the thermal expansion of the transfer mechanism at the target position to which the substrate is to be transferred; and controlling the transfer mechanism such that the reference position of the holder becomes the corrected target position.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a schematic view for explaining an example of a correction of a target position.

DETAILED DESCRIPTION

Figure 1:
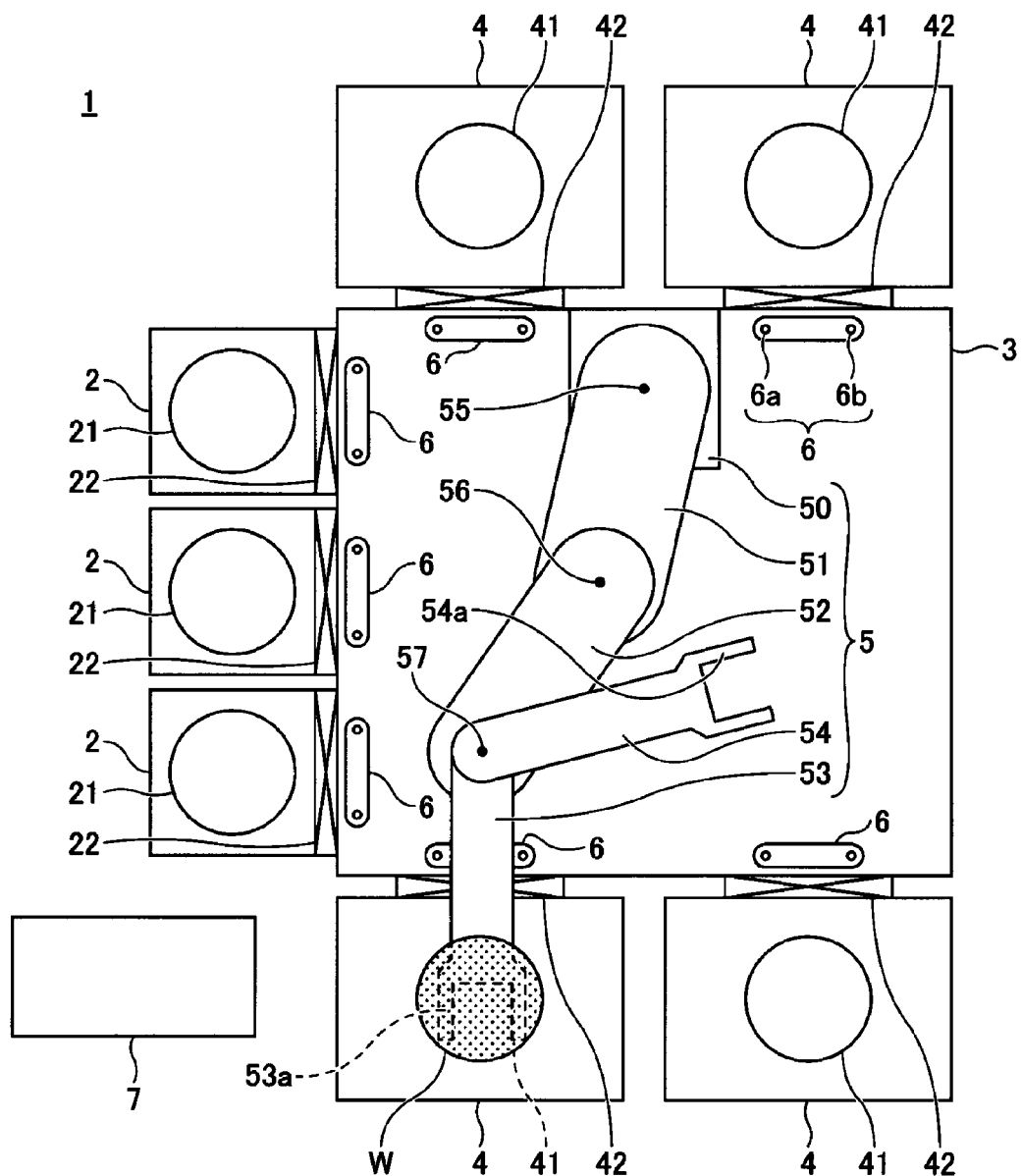
FIG. 1 is a plan view illustrating an example of a configuration of a substrate processing system according to an embodiment.

Hereinafter, embodiments of the present disclosure will be described with reference to the accompanying drawings. In each of the drawings, the same components will be denoted by the same reference numerals, and redundant descriptions thereof may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments <Substrate Processing System>

First, an example of an overall configuration of a substrate processing system 1 according to an embodiment will be described with reference to FIG. 1. FIG. 1 is a plan view illustrating an example of a configuration of the substrate processing system 1 according to an embodiment. In FIG. 1, the substrate W is hatched with dots. In the following description, it is assumed that the substrate W is held by a third arm 53 of a transfer mechanism 5 and is transferred from a vacuum transfer chamber 3 on a stage 41 in a processing chamber 4.

The substrate processing system 1 illustrated in FIG. 1 is a system having a cluster structure (multi-chamber type).

The substrate processing system 1 includes load-lock chambers 2, a vacuum transfer chamber 3, processing chambers 4, a transfer mechanism 5, sensors 6, and a controller 7. In addition, the transfer mechanism 5, the sensors 6, and the controller 7 constitute a substrate transfer system for transferring the substrate W.

Each of the load-lock chambers 2 is provided between the vacuum transfer chamber 3 and an atmospheric transfer chamber (not illustrated). Each load-lock chamber 2 has a stage 21 on which the substrate W is placed. The interior of each load-lock chamber 2 is configured to be switched between an atmospheric environment and a vacuum atmosphere. Each load-lock chamber 2 and the vacuum transfer chamber 3 kept in the vacuum atmosphere are in communication with each other by opening/closing of a respective gate valve 22. Each load-lock chamber 2 and the atmospheric transfer chamber (not illustrated) kept in the atmospheric atmosphere are in communication with each other by opening/closing of a gate valve (not illustrated). The switching of the interior of the load-lock chambers 2 between the vacuum atmosphere and the atmospheric atmosphere is controlled by the controller 7.

The vacuum transfer chamber 3 is depressurized to a predetermined vacuum atmosphere. Further, the vacuum transfer chamber 3 includes a transfer mechanism 5 provided therein to transfer the substrate W.

The processing chambers 4 are arranged adjacent to the vacuum transfer chamber 3. Each processing chamber 4 includes a stage 41 on which the substrate W is placed. Each processing chamber 4 is depressurized to a predetermined vacuum atmosphere. A desired process (e.g., etching, film-forming, cleaning, ashing, or the like) is performed on the substrate W placed on the stage 41 inside each processing chamber 4. Each processing chamber 4 and the vacuum transfer chamber 3 communicate with each other by opening/closing a respective gate valve 42. The operation of each part for processing in each processing chamber 4 is controlled by the controller 7.

The transfer mechanism 5 transfers the substrate W between each load-lock chamber 2 and the vacuum transfer chamber 3 according to the opening/closing of the gate valve 22. In addition, the transfer mechanism 5 transfers the substrate W between each processing chamber 4 and the vacuum transfer chamber 3 according to the opening/closing of the gate valve 42. The operation of the transfer mechanism 5, and the opening and closing of the gate valves 22 and 42 are controlled by the controller 7.

The transfer mechanism 5 is configured as an articulated arm including, for example, a base part 50, a first arm 51, a second arm 52, a third arm 53, and a fourth arm 54. The base part 50 and one side of the first arm 51 in the longitudinal direction are rotatably connected to each other by a rotation shaft 55. The other side of the first arm 51 in the longitudinal direction and one side of the second arm 52 in the longitudinal direction are rotatably connected to each other by a rotation shaft 56. The other side of the second arm 52 in the longitudinal direction and one side of the third arm 53 in the longitudinal direction are rotatably connected to each other by a rotation shaft 57. The other side of the third arm 53 in the longitudinal direction has a holder 53*a* configured to hold (place) the substrate W. The other side of the second arm 52 in the longitudinal direction and one side of the fourth arm 54 in the longitudinal direction are rotatably connected to each other by the rotation shaft 57. The other side of the fourth arm 54 in the longitudinal direction has a holder 54*a* configured to hold (place) the substrate W.

A sensor (a measurement part) 6 configured to detect the substrate W transferred by the transfer mechanism 5 is provided inside the vacuum transfer chamber 3 for each processing chamber 4 and each load-lock chamber 2. The sensor 6 is provided at a position through which the substrate W passes when the transfer mechanism 5 transfers the substrate W from the vacuum transfer chamber 3 into the processing chamber 4 or the load-lock chamber 2, or when the transfer mechanism 5 transfers the substrate W from the processing chamber 4 or the load-lock chamber 2 into the vacuum transfer chamber 3.

The sensor 6 has two sensors 6*a* and 6*b*. The sensors 6*a* and 6*b* are, for example, photoelectric sensors, and are capable of detecting four points on the outer periphery of the substrate W when the substrate W held by the transfer mechanism 5 passes through the sensors 6*a* and 6*b*. The controller 7 detects coordinates on the outer periphery of the substrate W held by the third arm 53 based on the detection of the outer periphery of the substrate W by the sensor 6 (the sensors 6*a* and 6*b*) and the operation of the transfer mechanism 5 at that time. Then, the controller 7 calculates the center position of the substrate W from the detected coordinates of the four points on the outer periphery. Thus, the sensor 6 and the controller 7 function as a measurement part for measuring the center position of the substrate W held by the third arm 53. As a result, the controller 7 detects a deviation (decentering amount) between a preset reference position (e.g., the center position of the holder 53*a*) at which the substrate W is placed on the third arm 53 and the center position of the substrate W held by the third arm 53 and detected using the sensor 6.

The controller 7 has a central processing unit (CPU), a read only memory (ROM), a random access memory (RAM), and a hard disk drive (HDD). The controller 7 may have other storage areas, such as a solid-state drive (SSD) without being limited to the HDD. A recipe in which process procedures, process conditions, and transfer conditions are set is stored in the storage area such as the HDD, the RAM or the like.

The CPU controls processing of the substrate W in each processing chamber according to the recipe, and controls the transfer of the substrate W. The HDD or RAM may store a program for executing the processing of the substrate W in each processing chamber and the transfer of the substrate W. The program may be provided while being stored in the storage medium, or may be provided from an external device via a network.

<Transfer Mechanism>

Figure 2:
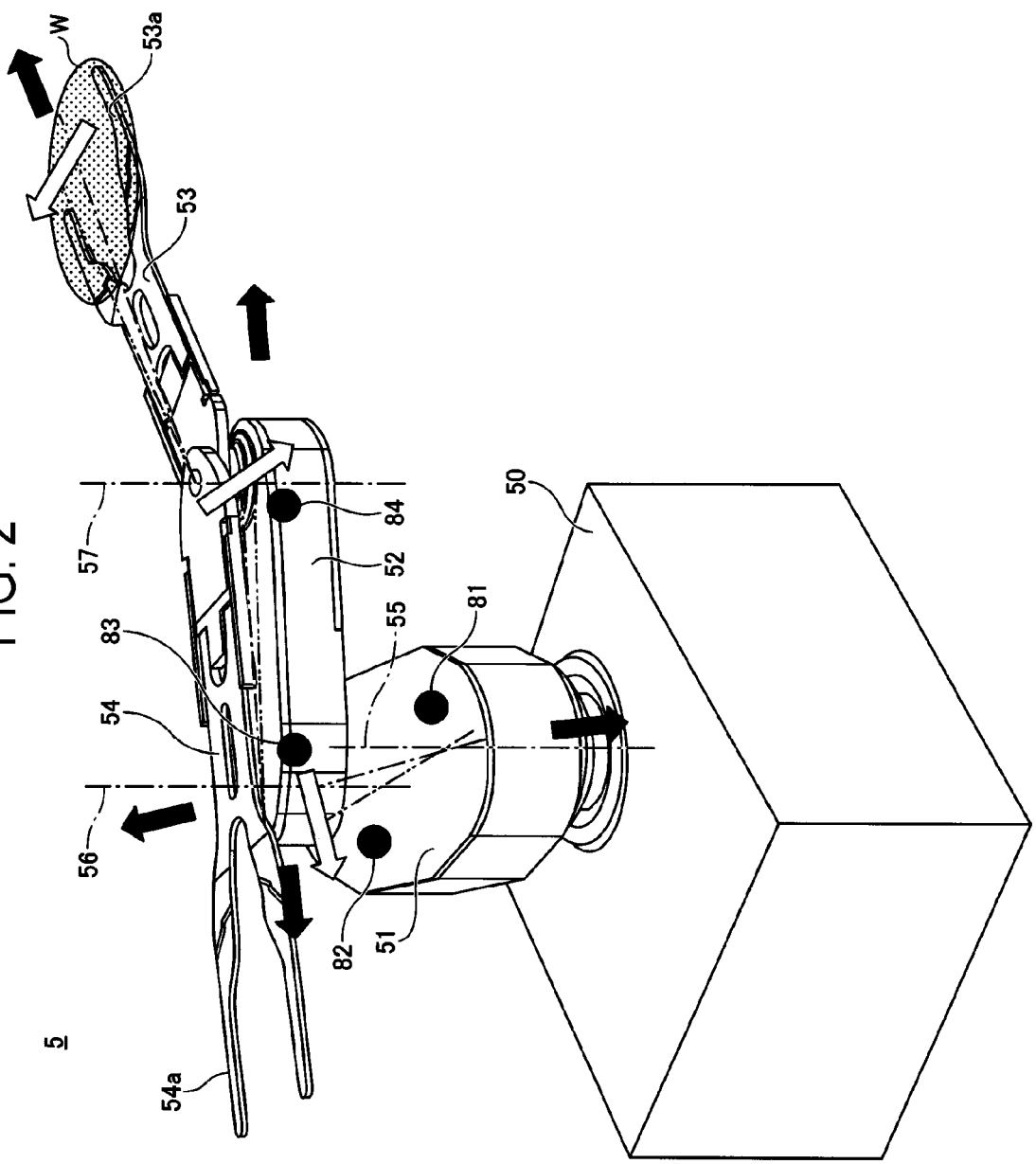
FIG. 2 is a perspective view illustrating an example of a transfer mechanism.
Figure 3:
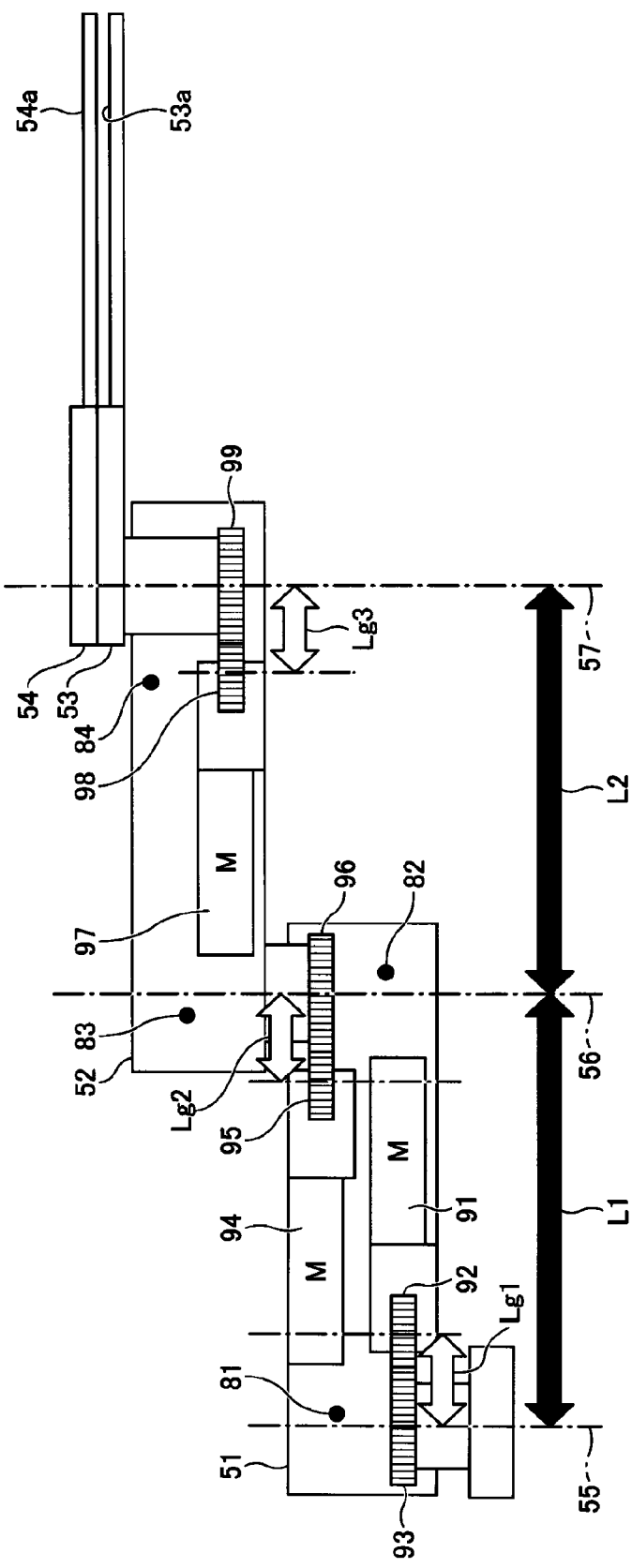
FIG. 3 is a schematic view illustrating an example of a configuration of the transfer mechanism.

Next, the transfer mechanism 5 will be further described with reference to FIGS. 2 and 3. FIG. 2 is a perspective view illustrating an example of the transfer mechanism 5. FIG. 3 is a schematic view illustrating an exemplary configuration of the transfer mechanism 5.

The first arm 51 is provided with temperature sensors (temperature detectors) 81 and 82. As the temperature sensors 81 and 82, for example, thermocouples may be used. The temperature sensor 81 is provided on one side of the first arm 51 (the side of the rotation shaft 55) in the longitudinal direction. The temperature sensor 82 is provided on the other side of the first arm 51 (the side of the rotation shaft 56) in the longitudinal direction. A temperature of the first arm 51 detected by the temperature sensors 81 and 82 is input to the controller 7.

The second arm 52 is provided with temperature sensors (temperature detectors) 83 and 84. As the temperature sensors 83 and 84, for example, thermocouples may be used. The temperature sensor 83 is provided on one side of the second arm 52 (the side of the rotation shaft 56) in the longitudinal direction. The temperature sensor 84 is provided on the other side of the second arm 52 (the side of the rotation shaft 57) in the longitudinal direction. A temperature of the second arm 52 detected by the temperature sensors 83 and 84 is input to the controller 7.

A first shaft motor 91 used as a drive source is provided inside the first arm 51. The first shaft motor 91 rotates a gear 92. A gear 93 is fixed to the base part 50 and is arranged coaxially with the rotation shaft 55. The gear 92 and the gear 93 are engaged with each other to form a power transmission mechanism. As a result, the first shaft motor 91 rotates the first arm 51 with respect to the base part 50 using the rotation shaft 55.

A second shaft motor 94 used as a drive source is provided inside the first arm 51. The second shaft motor 94 rotates a gear 95. A gear 96 is fixed to the second arm 52 and is arranged coaxially with the rotation shaft 56. The gear 95 and the gear 96 are engaged with each other to form a power transmission mechanism. As a result, the second shaft motor 94 rotates the second arm 52 with respect to the first arm 51 using the rotation shaft 56.

A third shaft motor 97 used as a drive source is provided inside the second arm 52. The third shaft motor 97 rotates a gear 98. A gear 99 is fixed to the third arm 53 and is arranged coaxially with the rotation shaft 57. The gear 98 and the gear 99 are engaged with each other to form a power transmission mechanism. As a result, the third shaft motor 97 rotates the third arm 53 with respect to the second arm 52 using the rotation shaft 57. Similarly, a motor (not illustrated) and a power transmission mechanism (not illustrated) are provided inside the second arm 52. The motor rotates the fourth arm 54 with respect to the second arm 52 using the rotation shaft 57.

In addition, a distance between the rotation shaft 55 and the rotation shaft 56 (a link length of the first arm 51) is assumed to be L1. A distance between the rotation shaft 56 and the rotation shaft 57 (a link length of the second arm 52) is assumed to be L2. An axial distance between the gear 92 and the gear 93 is assumed to be Lg1. An axial distance between the gear 95 and the gear 96 is assumed to be Lg2. An axial distance between the gear 98 and the gear 99 is assumed to be Lg3. A description will be made assuming that a material of each of the gears 92, 95, and 98 is Fe, and that a material of each of the first arm 51, the second arm 52, the third arm 53, and each of the gears 93, 96, and 99 is A1.

In the transfer mechanism 5, the first shaft motor 91 or the like provided inside the transfer mechanism 5 serves as a heat source and generates heat. In addition, heat is input to the transfer mechanism 5 from the processing chamber 4 maintained at a high temperature. Further, heat is input to the transfer mechanism 5 from the substrate W heated at a high temperature inside the processing chamber 4. As a result, the transfer mechanism 5 undergoes thermal expansion.

As illustrated by the black arrows in FIG. 2, the first arm 51, the second arm 52, and the third arm 53 of the transfer mechanism 5 thermally expand in the longitudinal direction.

In addition, backlash of the gears 92 and 93 increases due to the thermal expansion of the gears 92 and 93. In FIG. 2, a position of the central axis of the first arm 51 in the longitudinal direction is indicated by a one-dot chain line, and a position of the central axis of the first arm 51 in the longitudinal direction due to the backlash is indicated by a two-dot chain line. As illustrated by the white arrows in FIG. 2, when the first arm 51 is rotated by the gears 92 and 93 using the rotation shaft 55, an angle transmission error occurs. Similarly, even in the gears 95 and 96 and the gears 98 and 99, backlash increases and thus an angle transmission error occurs.

Figure 4:
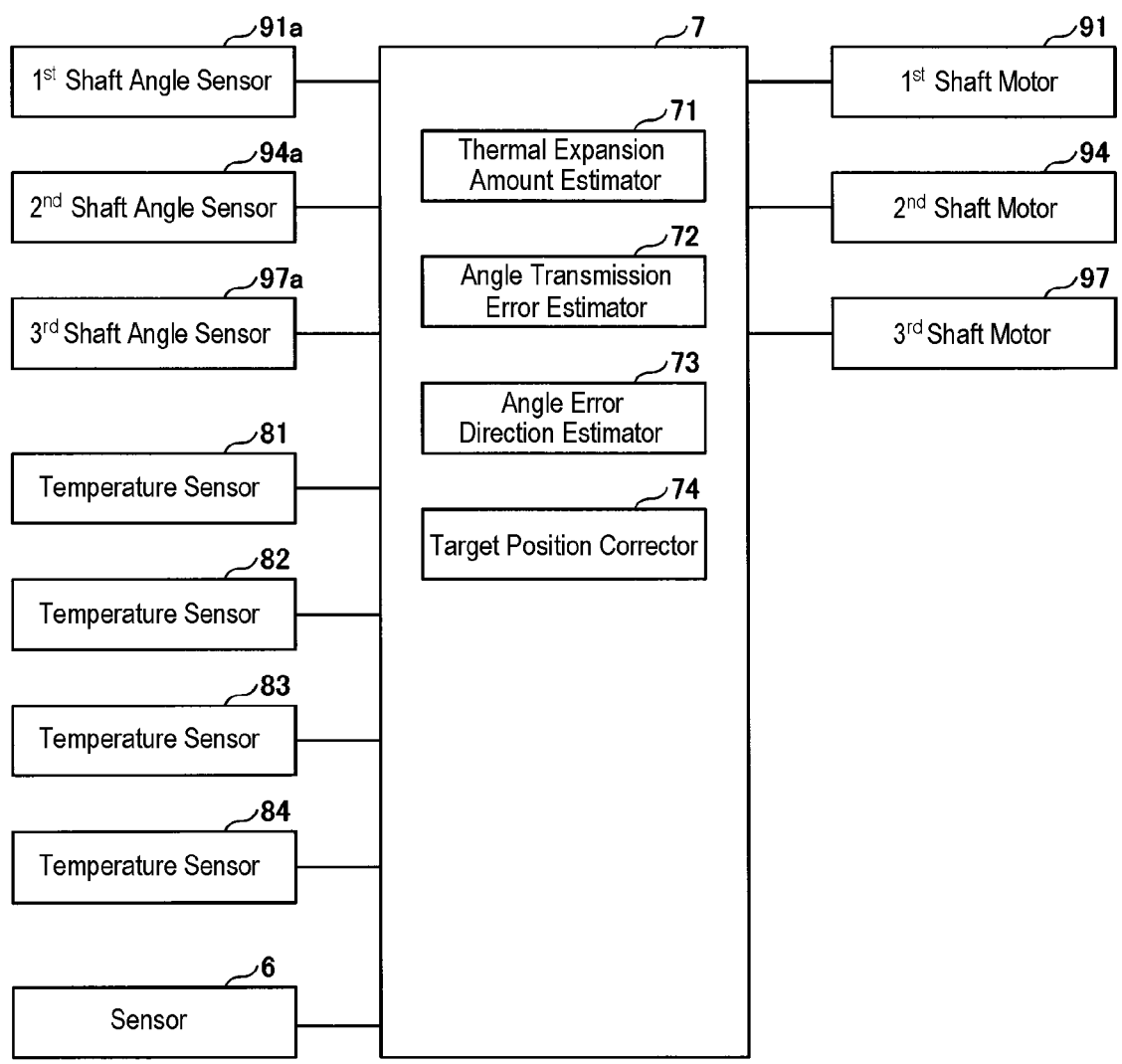
FIG. 4 is a functional block diagram illustrating an example of a controller.

Next, the controller 7 that controls the transfer mechanism 5 will be described with reference to FIG. 4. FIG. 4 illustrates an example of a functional block diagram of the controller 7.

A first shaft angle sensor 91a detects a rotation angle of the first shaft motor 91. A value detected by the first shaft angle sensor 91a is input to the controller 7. A second shaft angle sensor 94a detects a rotation angle of the second shaft motor 94. A value detected by the second shaft angle sensor 94a is input to the controller 7. A third shaft angle sensor 97a detects a rotation angle of the third shaft motor 97. A value detected by the third shaft angle sensor 97a is input to the controller 7.

In addition, the values detected by the temperature sensors 81 to 84 are input to the controller 7. The value detected by the sensor 6 is input to the controller 7.

The controller 7 controls the first shaft motor 91, the second shaft motor 94, and the third shaft motor 97. The controller 7 controls the operation of the transfer mechanism 5 by controlling the first shaft motor 91, the second shaft motor 94, and the third shaft motor 97 based on the values detected by the first shaft angle sensor 91a, the second shaft angle sensor 93a, and the third shaft angle sensor 97a.

The controller 7 includes a thermal expansion amount estimator 71, an angle transmission error estimator 72, an angle error direction estimator 73, and a target position corrector 74.

The thermal expansion amount estimator 71 estimates amounts of thermal expansion of the first arm 51 and the second arm 52.

The amount of thermal expansion of the first arm 51 is estimated based on, for example, the temperature of the first arm 51, a thermal expansion coefficient of the first arm 51, and the reference link length L1 of the first arm 51. The temperature of the first arm 51 is detected by the temperature sensors 81 and 82. For example, the average value of the temperature sensors 81 and 82 may be the temperature of the first arm 51. When the first arm 51 is made of A1, the thermal expansion coefficient of the first arm 51 may be a thermal expansion coefficient of A1. The reference link length L1 of the first arm 51 is a link length of the first arm 51 at a reference temperature.

The amount of thermal expansion of the second arm 52 is estimated based on, for example, the temperature of the second arm 52, a thermal expansion coefficient of the second arm 52, and the reference link length L2 of the second arm 52. The temperature of the second arm 52 is detected by the temperature sensors 83 and 84. For example, the average value of the temperature sensors 83 and 84 may be the temperature of the second arm 52. When the second arm 52 is made of A1, the thermal expansion coefficient of the second arm 52 may be a thermal expansion coefficient of A1. The reference link length L2 of the second arm 52 is a link length of the second arm 52 at a reference temperature.

The angle transmission error estimator 72 estimates an amount of angle transmission error due to gear backlash.

The amount of angle transmission error when the first arm 51 is rotated using the rotation shaft 55 is estimated based on, for example, the temperatures of the gears 92 and 93, a difference in the thermal expansion coefficient between the gears 92 and 93, and the reference axial distance Lg1 between the gears 92 and 93. The temperatures of the gears 92 and 93 are detected by, for example, the temperature sensor 81. When the gear 92 is made of Fe and the gear 93 is made of A1, the difference in the thermal expansion coefficient between the gears 92 and 93 may be a difference between a thermal expansion coefficient of A1 and a thermal expansion coefficient of Fe. The reference axial distance Lg1 is an axial distance between the gears 92 and 93 at a reference temperature.

The amount of angle transmission error when the second arm 52 is rotated using the rotation shaft 56 is estimated based on, for example, the temperatures of the gears 95 and 96, a difference in the thermal expansion coefficient between the gears 95 and 96, and the reference axial distance Lg2 between the gears 95 and 96. The temperatures of the gears 95 and 96 are detected by, for example, the temperature sensor 82. When the gear 95 is made of Fe and the gear 96 is made of A1, the difference in the thermal expansion coefficient between the gears 95 and 96 may be the difference between the thermal expansion coefficient of A1 and the thermal expansion coefficient of Fe. The reference axial distance Lg2 is an axial distance between the gears 95 and 96 at a reference temperature.

The amount of angle transmission error when the third arm 53 is rotated using the rotation shaft 57 is estimated based on, for example, the temperatures of the gears 98 and 99, a difference in the thermal expansion coefficient between the gears 98 and 99, and the reference axial distance Lg3 between the gears 98 and 99. The temperatures of the gears 98 and 99 are detected by, for example, the temperature sensor 84. When the gear 98 is made of Fe and the gear 99 is made of A1, the difference in the thermal expansion coefficient between the gears 98 and 99 may be the difference between the thermal expansion coefficient of A1 and the thermal expansion coefficient of Fe. The reference axial distance Lg3 is an axial distance between the gears 98 and 99 at a reference temperature. The amount of angle transmission error when the fourth arm 54 is rotated using the rotation shaft 57 is also estimated in the same manner.

The angle error direction estimator 73 estimates a direction of an angle transmission error.

Figure 5A:
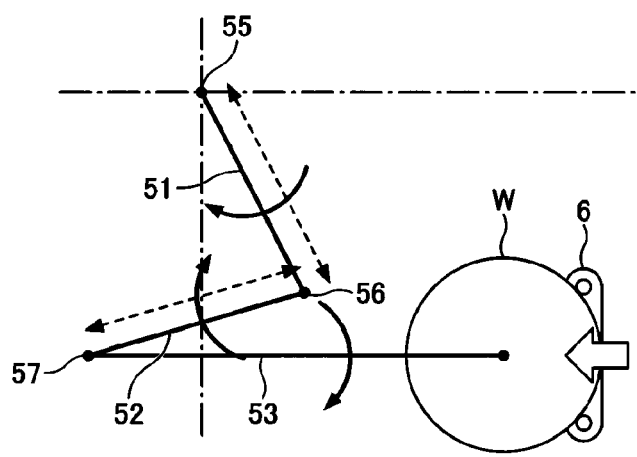
FIGS. 5A and 5B are views schematically illustrating examples of a posture of the transfer mechanism.
Figure 5B:
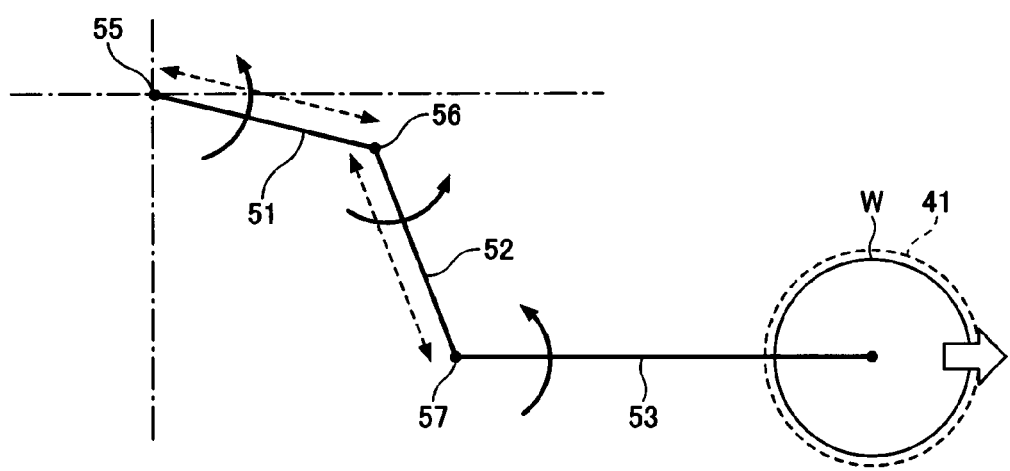

FIGS. 5A and 5B are views schematically illustrating examples of postures of the transfer mechanism 5. FIG. 5A is a view illustrating an example of the posture of the transfer mechanism 5 at a measurement position where the substrate W is measured by the sensor 6. FIG. 5B is a view illustrating an example of the posture of the transfer mechanism 5 at a target position of the substrate W to be transferred.

As indicated by the broken line arrows, the link lengths of the first arm 51 and the second arm 52 thermally expand. Since the reference position on the third arm 53 on which the substrate W is placed is set to a predetermined distance from the rotation shaft 57, it is not necessary to consider the thermal expansion of the third arm 53.

Further, at the measurement position illustrated in FIG. 5A, the transfer mechanism 5 allows the substrate W to pass over the sensor 6 in a state in which the substrate W is accelerated. Therefore, the substrate W being transferred receives an inertial force in a direction indicated by the white arrow. Meanwhile, at the target position illustrated in FIG. 5B, the transfer mechanism 5 is directed toward the target position of the stage 41 in a state in which the substrate W is decelerated, and then stops. Therefore, the substrate W being transferred receives the inertial force in the direction indicated by the white arrow.

Figure 6A:
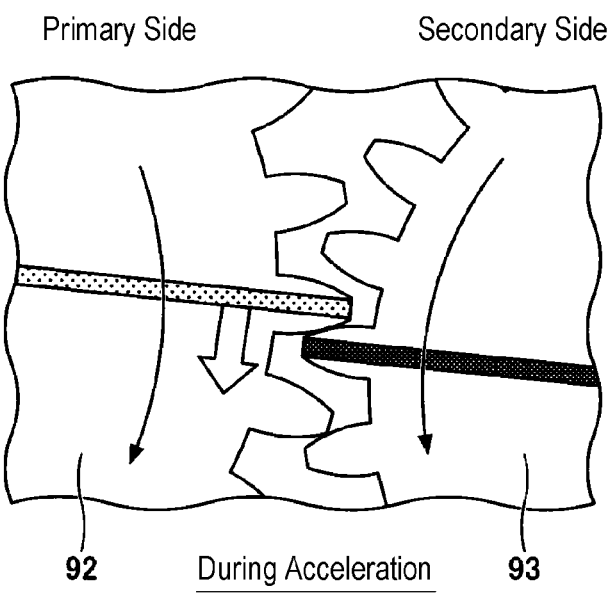
FIGS. 6A and 6B are views illustrating examples of an error direction of an angle transmission error.
Figure 6B:
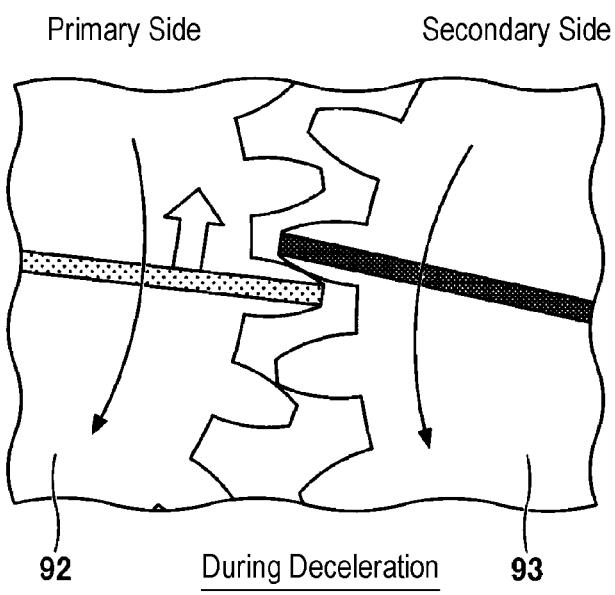

Here, a relationship between the acceleration/deceleration state and the error direction of the angle transmission error will be described with reference to FIGS. 6A and 6B. FIGS. 6A and 6B are views illustrating examples of the error direction of the angle transmission error. FIG. 6A illustrates the state in which the first shaft motor 91 is accelerated. FIG. 6B illustrates the state in which the first shaft motor 91 is decelerated. The solid arrows in FIGS. 6A and 6B indicate rotation directions of gears.

During the acceleration of the first shaft motor 91 illustrated in FIG. 6A, the gear 92 on the primary side rotates clockwise, and the gear 93 on the secondary side rotates counterclockwise. At this time, the teeth of the gear 92 on the primary side are in contact with the teeth of the gear 93 on the secondary side in the direction of pushing the teeth of the gear 93 on the secondary side due to an inertial force. As a result, the angle transmission error due to backlash occurs in the directions indicated by the white arrows.

Meanwhile, during the deceleration of the first shaft motor 91 illustrated in FIG. 6B, the gear 92 on the primary side rotates clockwise, and the gear 93 on the secondary side rotates counterclockwise. At this time, the teeth of the gear 93 on the secondary side are in contact with the teeth of the gear 92 on the primary side in the direction of pushing the teeth of the gear 92 on the primary side due to an inertial force. As a result, the angle transmission error due to backlash occurs in the directions indicated by the white arrows.

In this way, the directions of the angle transmission error due to the backlash of the gears 92 and 93 are different from each other depending on the acceleration and deceleration of the first shaft motor 91. This holds true in the direction of the angle transmission error due to the backlash of the gears 95 and 96 and the gears 98 and 99. In FIGS. 5A and 5B, examples of the directions of the angle transmission error are illustrated by the solid arrows. The direction of the angle transmission error changes at the measurement position illustrated in FIG. 5A and the target position illustrated in FIG. 5B.

The angle error direction estimator 73 estimates the direction of the angle transmission error when the first arm 51 is rotated using the rotation shaft 55 based on the acceleration/deceleration state of the first shaft motor 91. Similarly, the angle error direction estimator 73 estimates the direction of the angle transmission error when the second arm 52 is rotated using the rotation shaft 56 based on the acceleration/deceleration state of the second shaft motor 94. The angle error direction estimator 73 estimates the direction of the angle transmission error when the third arm 53 is rotated using the rotation shaft 57 based on the acceleration/deceleration state of the third shaft motor 97. The direction of the angle transmission error when the fourth arm 54 is rotated using the rotation shaft 57 is also estimated in the same manner.

The target position corrector 74 corrects the target position based on a positional deviation between the reference position of the third arm 53 and the center position of the substrate W held by the third arm 53, a positional deviation of the reference position of the third arm 53 due to thermal expansion at the measurement position, and a positional deviation of the reference position of the third arm 53 due to thermal expansion at the target position.

The positional deviation between the reference position of the third arm 53 and the center position of the substrate W held by the third arm 53 is estimated based on the value detected by the sensor 6.

The positional deviation (the amount of thermal displacement) of the reference position of the third arm 53 due to thermal expansion at the measurement position is calculated based on the amounts of thermal expansion of the first arm 51 and the second arm 52 estimated by the thermal expansion amount estimator 71, the amount of the angle transmission error estimated by the angle transmission error estimator 72, the direction of the angle transmission error at the measurement position (see FIG. 5A) estimated by the angle error direction estimator 73, and the posture of the transfer mechanism 5 (the values detected by the angle sensors 91a, 94a, and 97a).

The positional deviation (the amount of thermal displacement) of the reference position of the third arm 53 due to thermal expansion at the target position is calculated based on the amounts of thermal expansion of the first arm 51 and the second arm 52 estimated by the thermal expansion amount estimator 71, the amount of the angle transmission error estimated by the angle transmission error estimator 72, the direction of the angle transmission error at the target position (see FIG. 5B) estimated by the angle error direction estimator 73, and the posture of the transfer mechanism 5 (the values detected by the angle sensors 91a, 94a, and 9a).

Assuming that a change in temperature of the transfer mechanism 5 during the transfer of the substrate W is sufficiently small, it may be assumed that the amounts of thermal expansion of the first arm 51 and the second arm 52 at the measurement position and the target position and the amounts of angle transmission error at the rotation shafts 55, 56, and 57 are not changed. Meanwhile, the directions of the angle transmission error at the measurement position where the substrate W is being transferred in the acceleration state and the direction of the angle transmission error at the target position where the substrate W is being transferred in the deceleration state are different from each other. Further, the posture of the transfer mechanism 5 at the measurement position and the posture of the transfer mechanism 5 at the target position are different from each other. Therefore, the positional deviation of the reference position at the measurement position and the positional deviation of the reference position at the target position are different from each other.

Here, the correction of the target position will be further described with reference to FIG. 7. FIG. 7 is a schematic view illustrating an example of the correction of the target position. A position 100 indicates the target position. A position 101 is a reference position of the third arm 53 when control for moving the reference position of the third arm 53 (the center position of the holder 53a) to the target position without correction is performed. An arrow 111 indicates an amount of deviation (the amount of thermal displacement) of the reference position due to the thermal expansion of the third arm 53 at the target position. As illustrated in FIG. 5B, the thermal expansion of the transfer mechanism 5 causes the deviation of the reference position at the target position.

In a case in which the target position is corrected using the sensor 6 based on the deviation between the reference position of the third arm 53 (the center position of the holder 53a) and the center position of the substrate W held by the third arm 53, a position 102 corresponds to the reference position of the third arm 53 when control for moving the reference position of the third arm 53 to the corrected target position is performed. An arrow 110 indicates the amount of deviation of the reference position. As illustrated in FIG. 5A, the thermal expansion of the transfer mechanism 5 causes the deviation of the reference position at the measurement position. Therefore, the amount of positional deviation between the reference position of the third arm 53 and the center position of the substrate W held by the third arm 53 includes the amount of positional deviation of the reference position at the measurement position. Therefore, when the target position is corrected using the sensor 6 based on the positional deviation between the reference position of the third arm 53 and the center position of the substrate W held by the third arm 53, correction will be made by the amount of positional deviation of the reference position at the measurement position indicated by the arrow 111. That is, an amount of positional deviation (indicated by the arrow 110) occurs due to the overlapping of the amount of deviation (the amount of thermal displacement) of the reference position due to the thermal expansion of the third arm 53 at the target position indicated by the arrow 111 and a negative value of the amount of positional deviation (the amount of thermal displacement) of the reference position due to the thermal expansion of the third arm 53 at the measurement position indicated by the arrow 112.

Here, when the amount of positional deviation between the reference position of the third arm 53 detected by the sensor 6 and the center position of the substrate W held by the third arm 53 is (X0, Y0), the amount of positional deviation of the reference position at the measurement position is (X1, Y1), and the amount of positional deviation of the reference position at the target position is (X2, Y2), the amount of correction applied to the target position is represented by (−X0−X2+X1, −Y0−Y2+Y1).

In other words, based on the amount of positional deviation (X0, Y0) between the reference position of the third arm 53 detected by the sensor 6 and the center position of the substrate W held by the third arm 53 and the amount of positional deviation (X1, Y1) of the reference position at the measurement position, it is possible to obtain a true amount of positional deviation (X0−X1, Y0−Y1) between the reference position and the center position of the substrate W. Then, based on the amount of positional deviation (X2, Y2) of the reference position at the target position and the true amount of positional deviation (X0−X1, Y0−Y1) between the reference position and the center position of the substrate W, the amount of correction (X0−X2+X1, −Y0−Y2+Y1) of the target position is obtained.

Further, the controller 7 controls the transfer mechanism 5 such that the reference position of the third arm 53 becomes the corrected target position. For example, the controller 7 calculates a target angle of the rotation shaft 55, a target angle of the rotation shaft 56, and a target angle of the rotation shaft 57 based on the corrected target position. Further, the controller 7 controls the motors 91, 94, and 97 such that the values detected by the angle sensors 91a, 94a, and 97a become the respective target angles.

As described above, according to the substrate transfer system according to the present embodiment, it is possible to correct the target position in consideration of thermal displacement of the transfer mechanism 5. This makes it possible to improve transfer accuracy when the substrate W is transferred to the target position. It is possible to reduce the deviation between the center position of the substrate W transferred by the transfer mechanism 5 and the target position. Although the case where the substrate W is transferred by the third arm 53 has been described as an example, it is also possible to improve transfer accuracy by performing control in the same manner even in the case where the substrate W is transferred by the fourth arm 54.

Although embodiments of the substrate processing system 1, the substrate transfer system, and the like have been described above, the present disclosure is not limited to the above-described embodiments and the like, and various modifications, omissions, and substitutions can be made within the scope of the gist of the present disclosure as set forth in the claims.

The transfer mechanism 5 has been described as being provided with a temperature sensor for each arm, but the present disclosure is not limited thereto. In an arm that is not provided with a temperature sensor, a temperature of the arm may be estimated based on temperatures of front and rear arms and previously-acquired data.

According to an aspect of the present disclosure, it is possible to provide a method of controlling a substrate transfer system and the substrate transfer system, which improve transfer accuracy.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of controlling a substrate transfer system, the substrate transfer system including:
    a transfer mechanism including:
        an arm including a holder, which is configured to hold a substrate and configured to transfer the substrate; and
        a drive source configured to rotate the arm via a power transmission mechanism including a plurality of gears; and
    a measurement part configured to detect points along a perimeter of the substrate being transferred by the transfer mechanism and measure a center position of the substrate, so as to transfer the substrate to a target position,
    the method comprising:
    calculating an amount of positional deviation between a reference position of the holder and the center position of the substrate by the measurement part;
    calculating a first amount of thermal displacement of the reference position of the holder by a thermal expansion of the transfer mechanism at a measurement position where the points along the perimeter of the substrate are detected by the measurement part;
    calculating a second amount of thermal displacement of the reference position of the holder by the thermal expansion of the transfer mechanism at the target position to which the substrate is to be transferred;
    correcting the target position based on the amount of positional deviation, the first amount of thermal displacement, and the second amount of thermal displacement; and
    controlling the transfer mechanism such that the reference position of the holder becomes the corrected target position,
    wherein the first amount of thermal displacement and the second amount of thermal displacement of the reference position of the holder are estimated based on: an amount of thermal expansion estimated based on a temperature of the arm; an amount of an angle transmission error of the power transmission mechanism estimated based on a temperature of the power transmission mechanism; and a direction of the angle transmission error estimated based on an acceleration/deceleration state of the drive source, and
    wherein the amount of the angle transmission error is estimated based on a reference axial distance between two gears of the plurality of gears at a reference temperature.

2. The method of claim 1, wherein the amount of the angle transmission error is further estimated based on temperatures of the two gears, a difference in thermal expansion coefficients between the two gears, and the reference axial distance between the two gears.

3. The method of claim 2, wherein the transfer mechanism includes a temperature detector configured to detect a temperature of the transfer mechanism.

4. A substrate transfer system comprising:
    a transfer mechanism including:
        an arm including a holder, which is configured to hold a substrate and configured to transfer the substrate; and
        a drive source configured to rotate the arm via a power transmission mechanism including a plurality of gears; and
    a measurement part configured to detect points along a perimeter of the substrate being transferred by the transfer mechanism and measure a center position of the substrate, so as to transfer the substrate to a target position; and
    a controller configured to control the transfer mechanism,
    wherein the controller is configured to:
    calculate an amount of positional deviation between a reference position of the holder and the center position of the substrate by the measurement part;
    calculate a first amount of thermal displacement of the reference position of the holder by a thermal expansion of the transfer mechanism at a measurement position where the points along the perimeter of the substrate are detected by the measurement part;
    calculate a second amount of thermal displacement of the reference position of the holder by the thermal expansion of the transfer mechanism at the target position to which the substrate is to be transferred;
    correct the target position based on the amount of positional deviation, the first amount of thermal displacement, and the second amount of thermal displacement; and
    control the transfer mechanism such that the reference position of the holder becomes the corrected target position,
    wherein the first amount of thermal displacement and the second amount of thermal displacement of the reference position of the holder are estimated based on: an amount of thermal expansion estimated based on a temperature of the arm; an amount of an angle transmission error of the power transmission mechanism estimated based on a temperature of the power transmission mechanism; and a direction of the angle transmission error estimated based on an acceleration/deceleration state of the drive source, and
    wherein the amount of the angle transmission error is estimated based on a reference axial distance between two gears of the plurality of gears at a reference temperature.

* * * * *